US006961864B2

(12) United States Patent
Horigan

(10) Patent No.: US 6,961,864 B2
(45) Date of Patent: Nov. 1, 2005

(54) METHOD AND APPARATUS FOR TERMINATING CLOCK SIGNALS UPON DISCONNECTION OF CLOCK TRACE FROM GROUND

(75) Inventor: John W. Horigan, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 547 days.

(21) Appl. No.: 10/150,317

(22) Filed: May 16, 2002

(65) Prior Publication Data

US 2003/0217304 A1 Nov. 20, 2003

(51) Int. Cl.[7] .............................. G06F 1/04; G06F 1/10
(52) U.S. Cl. ...................... 713/601; 713/600; 713/500; 713/300; 713/320; 713/322
(58) Field of Search ................................ 713/300, 320, 713/322, 323, 324, 500, 600, 601; 327/164, 165, 291, 292; 710/300, 301, 302, 303, 304

(56) References Cited

U.S. PATENT DOCUMENTS 4,963,907 A * 10/1990 Inoue et al. .................. 396/60
5,274,677 A * 12/1993 Ohuchi et al. ............... 375/356
5,603,036 A * 2/1997 Wells et al. ................. 713/322
5,799,194 A    8/1998 Allen et al.
6,232,820 B1   5/2001 Long et al.
6,301,671 B1 * 10/2001 Boice et al. ................. 713/322
6,675,305 B1 * 1/2004 Mohammad ................. 713/322

FOREIGN PATENT DOCUMENTS

EP          0476394 A2     3/1992

OTHER PUBLICATIONS

PCT Search Report, PCT/US03/12347, Mailed Jun. 5, 2004.

* cited by examiner

*Primary Examiner*—Lynne H. Browne
*Assistant Examiner*—James K. Trujillo
(74) *Attorney, Agent, or Firm*—Blakely, Sokoloff, Taylor and Zafman

(57) ABSTRACT

According to one embodiment, a computer system is disclosed. The computer system includes a first clock receiver, one or more clock traces coupled to the clock generator, and clock generator coupled to the one or more clock traces. The clock generator gates clock signals to the first clock receiver in response to detecting that the clock traces have been disconnected from electrical ground.

19 Claims, 3 Drawing Sheets

METHOD AND APPARATUS FOR TERMINATING CLOCK SIGNALS UPON DISCONNECTION OF CLOCK TRACE FROM GROUND

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to computer systems; more particularly, the present invention relates to the power management of mobile computer systems.

BACKGROUND

In the past several years, mobile computer systems, such as notebook computers, have become prevalent. However, because of the small, compact housing, power management within mobile computer systems has become an important concern.

Typically, various devices within a mobile computer system receive synchronization clock signals from a central clock source. The central clock source often includes a power management mechanism that determines whether the devices need a clock signal.

If all of the clock receiving devices are in a sleep mode (e.g., do not require a clock signal), the power management mechanism gates the clock, and no clock is transmitted. Consequently, power is conserved. However, if only one device is active and requires a clock signal, the clock signal is transmitted to all of the devices, even if the other devices are in a sleep mode. As a result, unnecessary power is consumed by transmitting clock signals to devices that are in a sleep mode.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism for gating a receiver terminated clock is described. According to one embodiment, a power management module within a clock receiving device removes an electrical ground from complementary clock traces. In response to detecting no ground coupled to the clock traces, a termination detector within a clock generator triggers a signal that results in clock signals being gated.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
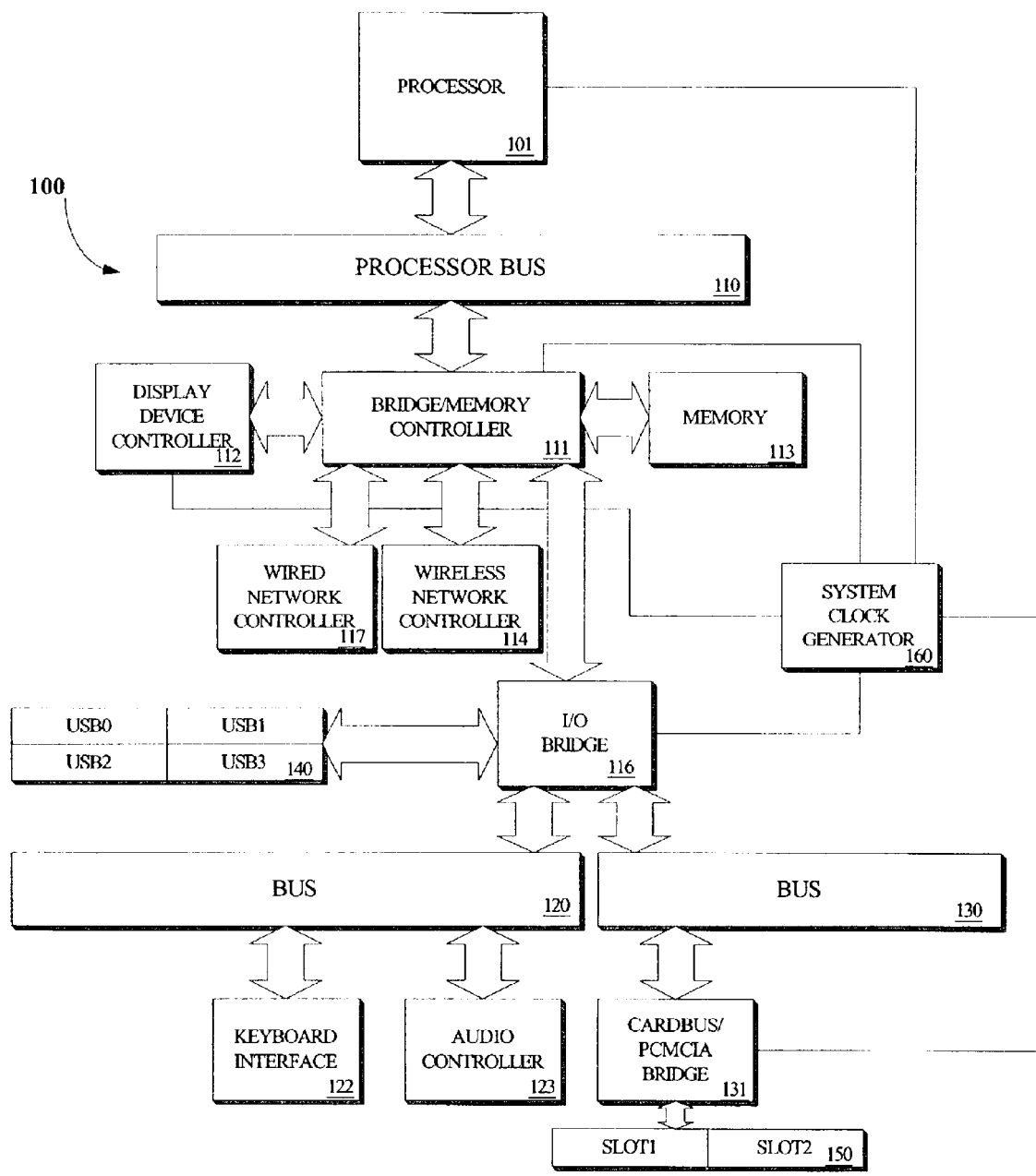
FIG. 1 is a block diagram of one embodiment of a computer system.

FIG. 1 is a block diagram of one embodiment of a computer system 100. Computer system 100 includes a processor 101. Processor 101 is coupled to a processor bus 110. Processor bus 110 transmits data signals between processor 101 and other components in computer system 100. Computer system 100 also includes a memory 113. In one embodiment, memory 113 is a dynamic random access memory (DRAM) device. However, in other embodiments, memory 113 may be a static random access memory (SRAM) device, or other memory device. Memory 113 may store instructions and code represented by data signals that may be executed by processor 101.

Computer system 100 further comprises a bridge memory controller 111 coupled to processor bus 110 and memory 113. Bridge/memory controller 111 directs data signals between processor 101, display device controller 112, memory 113, wireless network controller 114, wired network controller 117 and other components in computer system 100. In addition, bridge memory controller 111 bridges the data signals between processor bus 110, memory 113, and an input/output (I/O) bridge 116.

Network controllers 114 and 117 link computer system 100 to a network of computers (not shown in FIG. 1) and supports communication among the machines. Display device controller 122 is also coupled to bridge memory controller 111. Display device controller 112 allows coupling of a display device to computer system 100, and acts as an interface between the display device and computer system 100.

In one embodiment, display device controller 112 is a monochrome display adapter (MDA) card. In other embodiments, display device controller 112 may be a color graphics adapter (CGA) card, an enhanced graphics adapter (EGA) card, an extended graphics array (XGA) card or other display device controller.

The display device may be a television set, a computer monitor, a flat panel display or other display device. The display device receives data signals from processor 101 through display device controller 112 and displays the information and data signals to the user of computer system 100. In other embodiments, display device controller 112 may be integrated within bridge/memory controller 111.

I/O bridge 116 directs data signals between bridge/memory controller 111 and I/O devices coupled to I/O bridge 116 is coupled to a first I/O bus 120, a second I/O bus 130 and a Universal Serial Bus 140 adhering to a Specification Revision 2.0 bus.

I/O bus 120 may be a single bus or a combination of multiple buses. In one embodiment, I/O bus 120 is an Industry Standard Architecture (ISA) Specification Revision 1.0a bus developed by International Business Machines of Armonk, N.Y. However, other bus standards may also be used, for example Extended Industry Standard Architecture (EISA) Specification Revision 3.12 developed by Compaq Computer, et al. Alternatively, other busses may be used to implement I/O bus 120. I/O bus 120 provides communication links between components in computer system 100.

I/O bus 130 provides communication links between components in computer system 100. A keyboard interface 122 is coupled to I/O bus 120. Keyboard interface 122 may be a keyboard controller or other keyboard interface. In addition, keyboard interface 122 may be a dedicated device or can reside in another device such as a bus controller or other controller.

Keyboard interface 122 allows coupling of a keyboard to computer system 100 and transmits data signals from the keyboard to computer system 100. An audio controller 123 is also coupled to I/O bus 120. Audio controller 133 operates to coordinate the recording and playing of sounds.

I/O bus 130 may be a single bus or a combination of multiple buses. In a further embodiment, I/O bus 130 may be a Peripheral Component Interconnect adhering to a Specification Revision 2.1 bus developed by the PCI Special Interest Group of Portland, Oreg. Alternatively, other busses may be used to implement I/O bus 130. I/O bus 130 provides communication links between components in computer system 100.

In one embodiment, I/O bus 130 is coupled to a Personal Computer Memory Card International Association (PCMCIA) bus/bridge (CardBus controller) 131 developed by the PCMCIA of San Jose, Calif. CardBus controller 131 is coupled to PCMCIA slots 150.

According to one embodiment, a system clock generator 160 is also included in computer system 100. System clock generator 160 supplies clock signals to various devices within computer system 100. According to one embodiment, clock generator 160 generates clock signals based upon a combination of hardware straps received from other components within computer system 100. In a further embodiment, clock generator 160 transmits the generated clock signals to clock receiving devices within computer system 100, such as display device controller 112, memory 113, etc.

Figure 2:
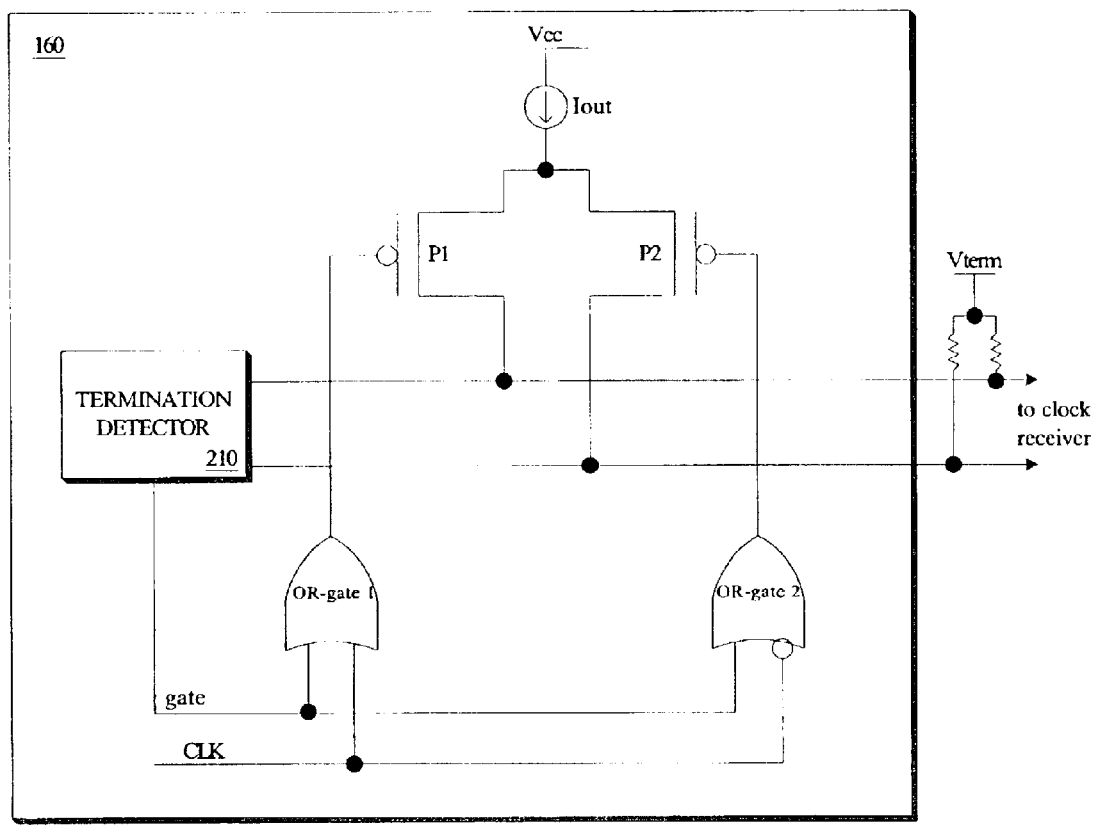
FIG. 2 is a block diagram of one embodiment of a clock generator.

FIG. 2 is a block diagram of one embodiment of clock generator 160. Clock generator 160 includes termination detector 210, PMOS transistors P1 and P2, and OR-gates 1 and 2. Termination detector 210 detects whether traces that transmit complementary clock signals to clock receiving devices are terminated to ground.

In one embodiment, termination detector 210 generates a gate signal that is used terminate the transmission of the clock signals if it is detected that the traces are not terminated to ground. In a further embodiment, termination detector 210 includes compare circuitry that compares the complementary clock signals.

In yet a further embodiment, the complementary clock signals do not have the same logic value whenever the traces are coupled to ground. Accordingly, termination detector identifies that the traces are not coupled to ground whenever the complementary clocks have approximately the same value.

In another embodiment, termination detector 210 compares the complementary clock signals to determine if the clock signals are less than 1V. If the values are less than 1V, the clocks are coupled to ground. However, if the clocks float above 1V close to a supply voltage Vcc, the complementary clocks are not coupled to ground.

OR-gates 1 and 2 are used to gate clock signals whenever termination detector 210 activates the gate signal. OR-gate 1 has one input coupled to termination detector 210 to receive the gate signal, and the other input coupled to receive the HCLK signals. Similarly, OR-gate 2 has one input coupled to termination detector 210 to receive the gate signal, and an inverted input coupled to receive the HCLK signals.

The output of OR-gate 1 is coupled to the gate of transistor P1, while the output of OR-gate 2 is coupled to the gate of transistor P2. The source of transistor P1 is coupled to current source Iout, while the drain is coupled to one of the clock traces. Likewise, the source of transistor P2 is coupled to Iout, while the drain is coupled to the other clock trace. Transistors P1 and P2 generate the complementary clock signals that are transmitted to clock receiving devices whenever their respective gates are activated by OR-gate 1 and OR-gate 2.

In one embodiment, termination resistors are coupled to the complimentary clock traces. In a further embodiment, the termination is a weak termination to a voltage, Vterm, above ground. Vterm may be Vcc or a voltage below Vcc. The termination prevents the clock traces from being completely floating when the ground termination is off and the clock generator 160 driver is also turned off (e.g., gated).

Also, in some instances a clock receiving device coupled to clock generator 160 may not be able to tolerate having the clocks rise to Vcc. For example, the receiver may have electrostatic discharge (ESD) protection diodes that will forward bias at high voltage, or it may have thin oxide transistors that cannot survive high voltages for extended periods of time. Vterm would be set at the maximum voltage the receiver can tolerate. The termination is sufficiently weak, and Vterm is high enough that the termination detector 210 can recognize when a clock receiver has turned off the ground termination.

Figure 3:
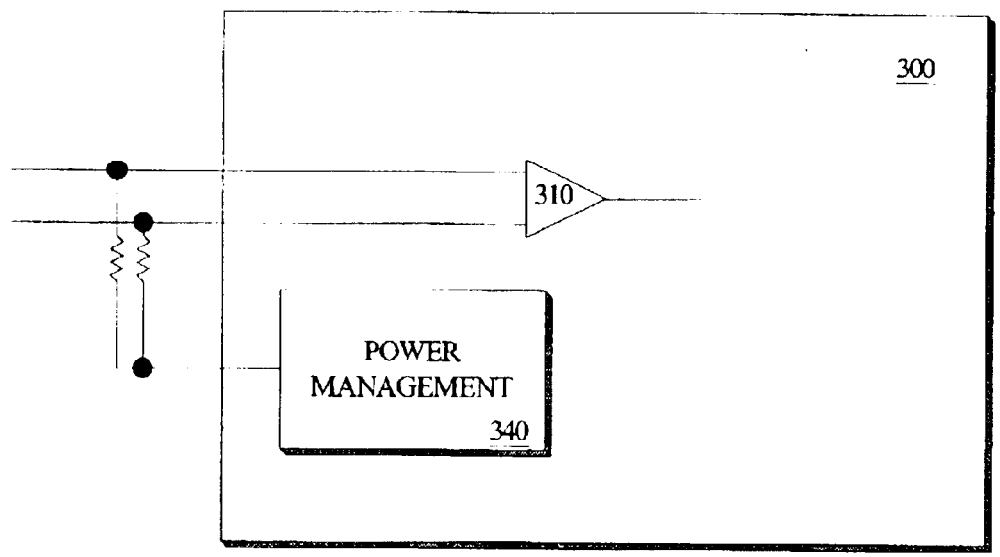
FIG. 3 is a block diagram of one embodiment of a clock receiver.

FIG. 3 is a block diagram of one embodiment of a clock receiver 300. Clock receiver 300 uses the clock signals received from clock generator 160 to operate an associated device. According to one embodiment, clock receiver 300 is a device coupled to processor bus 110. As described above, clock receiver 300 may include network controller 117 and display device controller 112. However, one of ordinary skill in the art will appreciate that clock receiver 300 may be implemented within other devices and/or at other locations within computer system 100.

Clock receiver 300 includes operational amplifier 310 and power management module 340. Amplifier 310 is coupled to the complementary clock traces received from clock generator 160. Amplifier 310 combines received complementary clock signals to form a single clock that is used to drive the device associated with clock receiver 300.

Power management module 340 is coupled to each of the complementary clock traces via termination resistors external to clock receiver 300. According to one embodiment, power management module 340 disconnects the clock traces from electrical ground. In one embodiment, power management module 340 detects when the associated device is in a sleep mode, and disconnects the grounding of the complementary traces. As a result, termination detector 210 at clock generator 160 detects that the traces are not grounded, and gates the clock signals.

Conversely, when power management module 340 detects that the device has become active, the traces are coupled to ground. Accordingly, clock generator 160 detects the grounding and de-gates the clock signals. In another embodiment, the grounding resistors are replaced with transistors within clock receiver 300 that are coupled to power management module 340.

Figure 4:
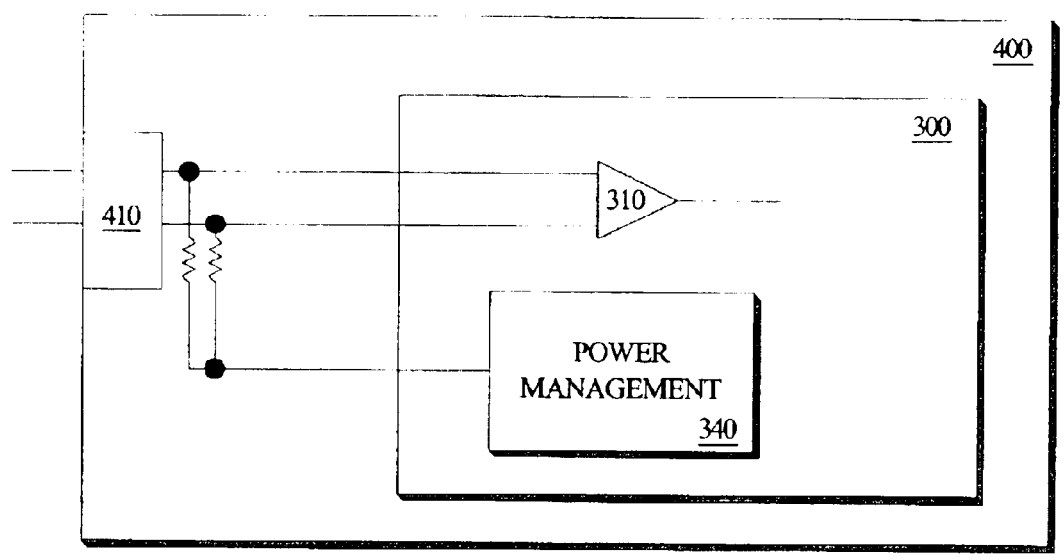
FIG. 4 is a block diagram of another embodiment of a substrate.

FIG. 4 is a block diagram of one embodiment of a substrate 400 that includes clock receiver 300. In this embodiment, clock receiver 300 is coupled to clock generator 160 via a connector 410. Connector 410 is used to connect or disconnect the associated device from the clock traces, in the case where a device can be disconnected. As described above, clock receiver 300 includes operational amplifier 310 and power management module 340.

Additionally, the termination resistors are located within clock receiver 300. According to one embodiment, the clock traces may be disconnected from ground by either power management module 300 being electrically disconnected from the traces, as described above, or by physically disconnecting the device from clocking clock generator 160.

In another embodiment, the termination resistors may be coupled to the ground of substrate 400. In such an embodiment, the termination is disconnected by physically disconnecting substrate 400. In any event, termination detector 210 detects the removal of the trace terminations to ground, and gates the clock signals.

The above-described clocking system enables a clock generator to gate an individual clock interface with a single device. Consequently, the clock generator can reduce the power generated by not generating clock signals for a device that is not active. Moreover, the clocking system enables an individual device to completely gate a clock via unidirectional communications.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A computer system comprising:
   a first clock receiver;
   one or more clock traces coupled to the clock receiver; and
   a clock generator having a termination detector coupled to the one or more clock traces to generate a state signal to terminate transmission of clock signals upon detecting that the clock traces have been disconnected from electrical ground.

2. The computer system of claim 1 wherein the first clock receiver disconnects the clock traces from electrical ground upon detecting that an associated device is in an inactive mode.

3. The computer system of claim 1 wherein the clock generator further comprises:
   a first OR-gate having one input coupled to the termination detector to receive the gate signal and another input coupled to receive a clock signal; and
   a second OR-gate having one input coupled to the termination detector to receive the gate signal and an inverted input coupled to receive a clock signal.

4. The computer system of claim 3 wherein the clock generator further comprises:
   a first transistor coupled to the output of the first OR-gate; and
   a second transistor coupled to the output of the first OR-gate.

5. The computer system of claim 4 further comprising a termination resistor coupled to each of the clock traces.

6. The computer system of claim 5 wherein the first clock receiver comprises a power management module coupled to the termination resistors.

7. The computer system of claim 4 wherein the first clock receiver comprises:
   a termination resistor coupled to each of the clock traces; and
   a power management module coupled to the termination resistors.

8. The computer system of claim 4 further comprising a substrate, wherein the substrate comprises:
   the first clock receiver; and
   a connector coupled to each of the clock traces.

9. The computer system of claim 8 further wherein the substrate further comprises:
   a second set of one or more clock traces coupled to the connector;
   termination resistors coupled to second set of clock traces; and
   a power management module coupled to the termination resistors.

10. The computer system of claim 1 wherein the clock generator gates clock signals to the first clock receiver in response to detecting that the clock traces have been disconnected from electrical ground.

11. A method comprising:
    detecting at a clock generator that one or more clock traces have been removed from an electrical ground;
    the clock generator generating a gate signal to terminate transmission of clock signals upon detecting that the one or more clock traces have been disconnected from electrical ground; and
    gating clock signals to be transmitted from the clock generator.

12. The method of claim 11 wherein detecting whether one or more clock traces have been removed from an electrical ground comprises comparing clock signal values on the clock traces.

13. The method of claim 12 further comprising the clock receiver determining whether the clock signal values are equivalent.

14. The method of claim 12 further comprising the clock receiver determining whether the clock signal values are less than 1 volt.

15. The method of claim 12 further comprising generating a gate signal at the clock generator once it is detected that one or more clock traces have been removed from an electrical ground.

16. A clock generator comprising:
    a termination detector, coupled to a first clock receiver via clock traces, to generate a gate signal to terminate transmission of clock signals upon detecting that the clock traces have been disconnected from electrical ground; and
    switching means, coupled to the one or more clock traces, that gates clock signals to the first clock receiver in response to the generation of the gate signal.

17. The clock generator of claim 16 wherein the further comprising:
    a first OR-gate having a first input coupled to the termination detector to receive the gate signal, a second input coupled to receive a clock signal and an output coupled to the switching means; and
    a second OR-gate having a first input coupled to the termination detector to receive the gate signal, an inverted input coupled to receive a clock signal and an output coupled to the switching means.

18. A clock generator comprising:

a termination detector, coupled to a first clock receiver via clock traces, to generate a gate signal to terminate transmission of clock signals upon detecting that the clock traces have been disconnected from electrical ground; and a first transistor coupled to a first of the clock traces; and a second transistor coupled to a second of the clock traces, the first and second transistors to gate the clock signals to the first clock receiver in response to the generation of the gate signal.

19. The clock generator of claim 18 wherein the further comprising:

a first OR-gate having a first input coupled to the termination detector to receive the gate signal, a second input coupled to receive a clock signal and an output coupled to the first transistor; and a second OR-gate having a first input coupled to the termination detector to receive the gate signal, an inverted input coupled to receive a clock signal and an output coupled to the second transistor.

* * * * *